United States Patent
Bianchi et al.

(10) Patent No.: US 6,504,380 B2
(45) Date of Patent: Jan. 7, 2003

(54) DEVICE AND METHOD FOR CHECKING INTEGRATED CAPACITORS

(75) Inventors: Raul Andrés Bianchi, Grenoble (FR); Benoît Froment, Grenoble (FR)

(73) Assignee: STMicroelectronics S.A., Montrouge (FR)

(*) Notice: Subject to any disclaimer, the term of this patent is extended or adjusted under 35 U.S.C. 154(b) by 0 days.

(21) Appl. No.: 09/874,896

(22) Filed: Jun. 5, 2001

(65) Prior Publication Data

US 2002/0057092 A1 May 16, 2002

(30) Foreign Application Priority Data

Jun. 6, 2000 (FR) .............................. 00 07227

(51) Int. Cl.$^7$ .............................................. G01R 31/12
(52) U.S. Cl. ...................................... 324/548; 324/522
(58) Field of Search ................................. 324/548, 522, 324/537, 765

(56) References Cited

PUBLICATIONS

Singh et al., Design Methodologies for C–2C Ladder–Based D/A Convertors for PCM Codecs, IEE Proceedings G. Electronic Circuits & Systems, GB, Institution of Electrical Engineers, Stevenage, vol. 135, No. 4, Part G, Aug. 1988, pp. 133–140.

Miller et al., An Acoustic Charge Transport Digitally Programmable Transversal Filter, IEEE Journal of Solid–State Circuits, US, IEEE Inc., New York, vol 24, No. 6, Dec. 1989, pp. 1675–1682.

Froment et al., Ultra Low capacitance measurements in multilevel metallisation CMOS by using a built–in Electron–Meter, International Electronc Devices Meeting 1999, Technical Digest (Cat. No. 99CH36318), Washington, DC, USA, Dec. 5–8, 1999, pp. 897–900.

*Primary Examiner*—Christine Oda
*Assistant Examiner*—Amy He
(74) *Attorney, Agent, or Firm*—Lisa K. Jorgenson; Allen, Dyer, Doppelt, Milbrath & Gilchrist, P.A.

(57) ABSTRACT

A device includes a capacitive structure including an input node and n output nodes, r integrated capacitors connected in series between two adjacent nodes, an integrated capacitor connected between the input node and ground, an integrated capacitor connected between the nth output node and ground, and r capacitive branches connected in parallel between ground and each node of the capacitive structure including the first output node and the (n–1)th output node. Each branch may include r+1 series-connected integrated capacitors. Furthermore, the integrated capacitors of the capacitive structure are theoretically identical. The device may also include a charge source for charging each node of the capacitive structure. Additionally, a measurement circuit may measure the charge at each of the nodes of the structure, and a comparison circuit may compare each measured nodal charge value with a theoretical nodal charge value while taking into account a predetermined nodal tolerance.

27 Claims, 4 Drawing Sheets

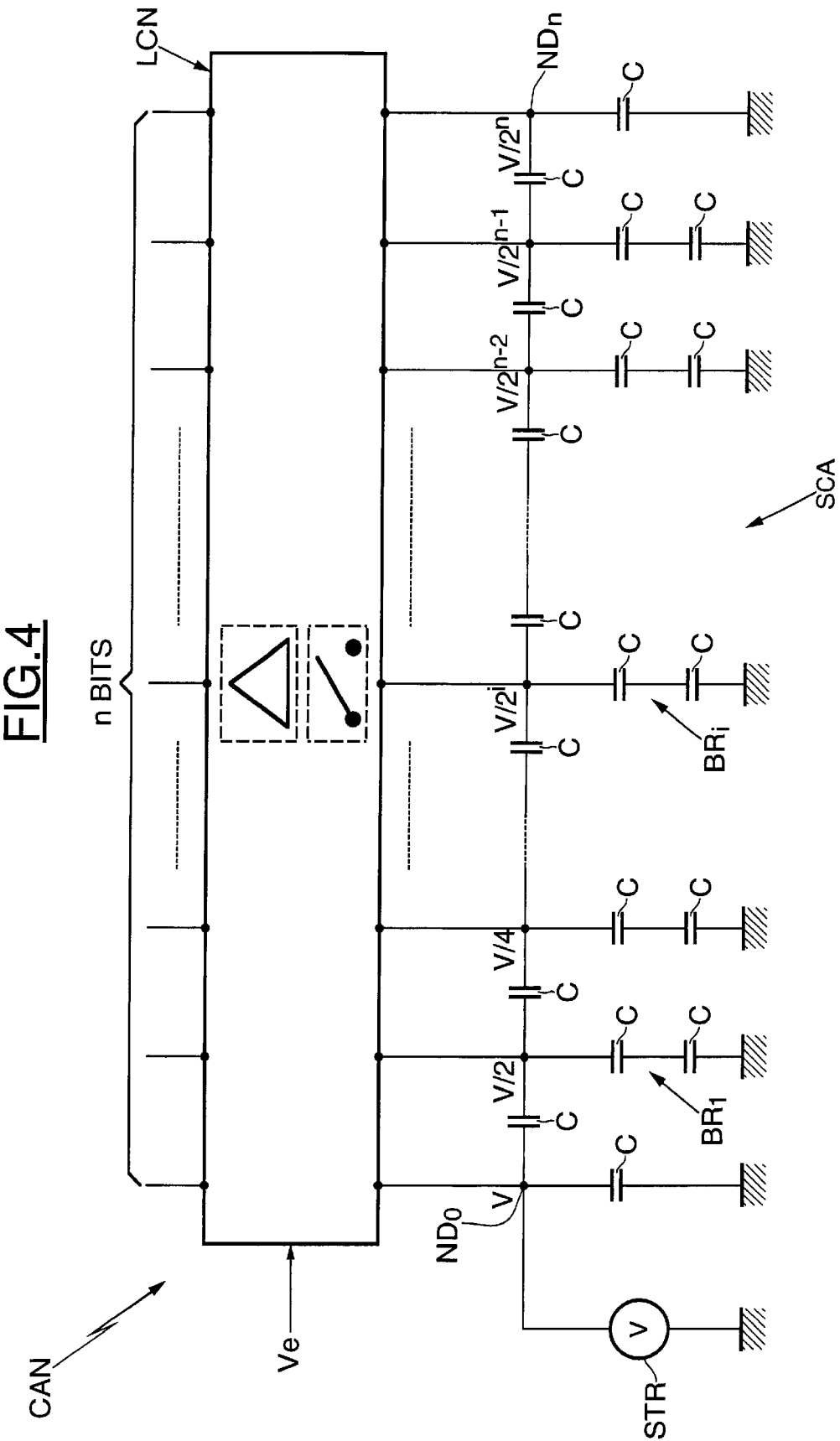

DEVICE AND METHOD FOR CHECKING INTEGRATED CAPACITORS

FIELD OF THE INVENTION

The invention relates to the field of integrated circuits, and, more particularly, to the checking of integrated capacitors, such as for matching and linearity. Moreover, the invention advantageously, but not exclusively, applies to the checking of the quality of capacitors of mass-produced integrated circuits. Further, the invention also relates to analog-digital converters using switched capacitors.

BACKGROUND OF THE INVENTION

An integrated circuit including, for example, a switched-capacitor analog-digital converter may include a certain number of capacitors which in theory are identical in their capacitive values. However, once the integrated circuit has been produced on silicon, these theoretically identical capacitors have in practice slightly different actual characteristics. These actual characteristics result in matching defects, i.e., there are differences between their respective actual capacitive values.

Such matching defects are due, for example, to plate surface areas which differ slightly from one capacitor to another or to differences in permittivity of the dielectrics from one capacitor to another. The causes of these differences are generally associated with the inevitable variations in the fabrication process (non-uniform quality of the oxide deposited, use of a plasma, location of the capacitors on the wafer, etc.).

These same variations may result in capacitors which display linearity defects, generally due to the quality of the dielectric. Those of skill in the art will appreciate that non-linearity of a capacitor results in a capacitive value which depends upon the voltage applied at its terminals, whereas in theory a capacitor is "linear," i.e., its capacitive value is independent from the voltage applied at its terminals.

At the present time, there are statistical laws which make it possible to determine the matching defects for pairs of adjacent capacitors. However, a simple way of checking the characteristics of capacitors produced while simultaneously determining the matching and linearity defects of theoretically identical integrated capacitors is not currently known.

SUMMARY OF THE INVENTION

An object of the invention is to provide a relatively simple method for checking capacitors.

Another object of the invention is to provide a system for determining the matching defect and the non-linearity of theoretically identical integrated capacitors, such as using a single decisional parameter which may be likened to a resolution in terms of number of bits.

Yet another object of the invention is to provide a system for quickly and efficiently checking the matching defect and the non-linearity of theoretically identical capacitors of integrated circuits mass-produced on a semiconductor wafer.

Still another object of the invention is to determine relatively simply the actual maximum resolution of analog-digital converters produced on integrated circuits.

A further object of the invention is to provide a reference voltage generator for analog-digital converters which is particularly robust and precise.

These and other objects, features, and advantages according to the invention are provided by a device for checking theoretically identical integrated capacitors, the device including a capacitive structure including an input node and n output nodes, n being an integer greater than or equal to 2. The capacitive structure also includes r integrated capacitors connected in series between two adjacent nodes, r being an integer greater than or equal to 1.

The capacitive structure may also include an integrated capacitor connected between the input node and ground and an integrated capacitor connected between the nth output node and ground. Furthermore, the capacitive structure may include r capacitive branches connected in parallel between ground and each node of the capacitive structure including the first output node and the (n−1)th output node. Each branch includes r+1 series-connected integrated capacitors. All the capacitors of the capacitive structure are theoretically identical.

The checking device may include, in addition to the capacitive structure, charging means capable of charging each node of the capacitive structure, measurement means capable of measuring the charge at each of the nodes of the structure, and comparison means capable of comparing each measured nodal charge value with a theoretical nodal charge value, taking into account a predetermined nodal tolerance. Although r can in theory take an integer value greater than or equal to 1, it is particularly beneficial to choose r=1, thereby making it possible to obtain a ratio of 2 between the voltages present at two adjacent nodes of the capacitive structure. This is particularly well suited to analog-digital conversion.

The charging means may include a reference voltage source and a controllable switch connected between the voltage source and the input node. Further, the measurement means may include, for each node of the capacitive structure, a controllable measurement switch connected to the node and an ammeter capable of being connected between the measurement switch and ground. The use of an ammeter for measuring a charge at each of the nodes of the capacitive structure is particularly advantageous compared with measuring voltages at the terminals of capacitors. This is because a voltmeter has parasitic capacitances which may falsify the measurement.

Advantageously, the device may also include a controllable discharge switch for each node of the capacitive structure connected between the node and ground. This makes it possible to discharge all the capacitors before taking the measurement.

The device according to the invention may advantageously be used for checking integrated capacitors of an integrated circuit on a die of a semiconductor wafer and bounded by dicing streets formed in the wafer. Advantageously, the capacitive structure is then inserted into one of the dicing streets by which the die is bounded. The plate surface area of the capacitors of the capacitive structure is then chosen to be at most equal to the minimum plate surface area of the capacitors of the integrated circuit.

In other words, if the integrated circuit includes capacitors of the same plate surface area, for example, a capacitive structure including capacitors of identical plate surface area will then be chosen. However, if the integrated circuit includes capacitors having different plate surface areas (e.g., one group of capacitors having a first predetermined plate surface area and another group of capacitors having a second plate surface area equal to half the first plate surface area), then a capacitive structure will be chosen whose capacitors have a plate surface area equal to the second plate surface area. This is because the greater the plate surface area of the capacitors, the better the matching between these capacitors. Thus, if the checking device of the invention results in matching that is acceptable for capacitors having the minimum surface area, the same will apply a fortiori to capacitors having a larger surface area.

The capacitive structure of the device according to the invention may also be used as a reference voltage or charge generator for a switched-capacitor analog-digital converter. In this case, a voltage source is connected to the input node. The various reference voltages or charges are then available at the various nodes (which are output nodes) of the capacitive structure, respectively. The use of such a capacitive structure for switched-capacitor analog-digital converters is particularly advantageous because it is, by nature, less sensitive to the matching defects of the capacitors as well as their linearity defects.

The invention also relates to a method of checking theoretically identical integrated capacitors in a capacitive structure which includes an input node and n output nodes (n being an integer greater than or equal to 2), and r integrated capacitors connected in series between two adjacent nodes (r being an integer greater than or equal to 1). Further, an integrated capacitor is connected between the input node and ground, an integrated capacitor is connected between the nth output node and ground, and r capacitive branches are connected in parallel between ground and each node of the capacitive structure including the first output node and the (n−1)th output node. Each branch includes r+1 series-connected integrated capacitors, and all the capacitors of the capacitive structure are theoretically identical. According to the method, each node of the capacitive structure may be charged via the input node, the charge at each of the nodes of the structure may be measured, and each measured nodal charge value may be compared with a theoretical nodal charge value taking into account a predetermined nodal tolerance.

The measurement of charge at a node may include a succession of steps carried out at a predetermined frequency over a predetermined time. These steps may include discharging all the nodes, charging of all the nodes, connecting an ammeter between the node to be measured and ground, and disconnecting the ammeter. In other words, the charge at the node in question is measured several times per second, thereby making it possible to obtain an average of the measurements resulting in a more precise reading and the removal of the random-type capacitive noise.

The frequency should be high enough to allow the ammeter to take an average and to deliver a current which is high enough and therefore able to be measured accurately. On the other hand, to prevent charge from being injected into the switches and causing parasitic phenomena, this frequency should not be too high. Those skilled in the art will understand how to adjust the value of this frequency according to the characteristics of the capacitive structure and the application in question.

By way of example, for a capacitive structure whose capacitors have a capacitive value of 1 pF, a frequency of between 100 kHz and 10 MHz (e.g., on the order of about 1 MHZ) may be chosen. Further, the measurement may be carried out over a period of seconds, e.g., about three seconds.

BRIEF DESCRIPTION OF THE DRAWINGS

Further advantages and characteristics of the invention will become apparent upon examining the detailed description of embodiments and methods of implementation, given by way of non-limiting example, and the appended drawings, in which:

FIG. 4 is a schematic diagram illustrating a switched-capacitor analog-digital converter including a capacitive structure according to the invention.

DETAILED DESCRIPTION OF THE PREFERRED EMBODIMENTS

Figure 1:
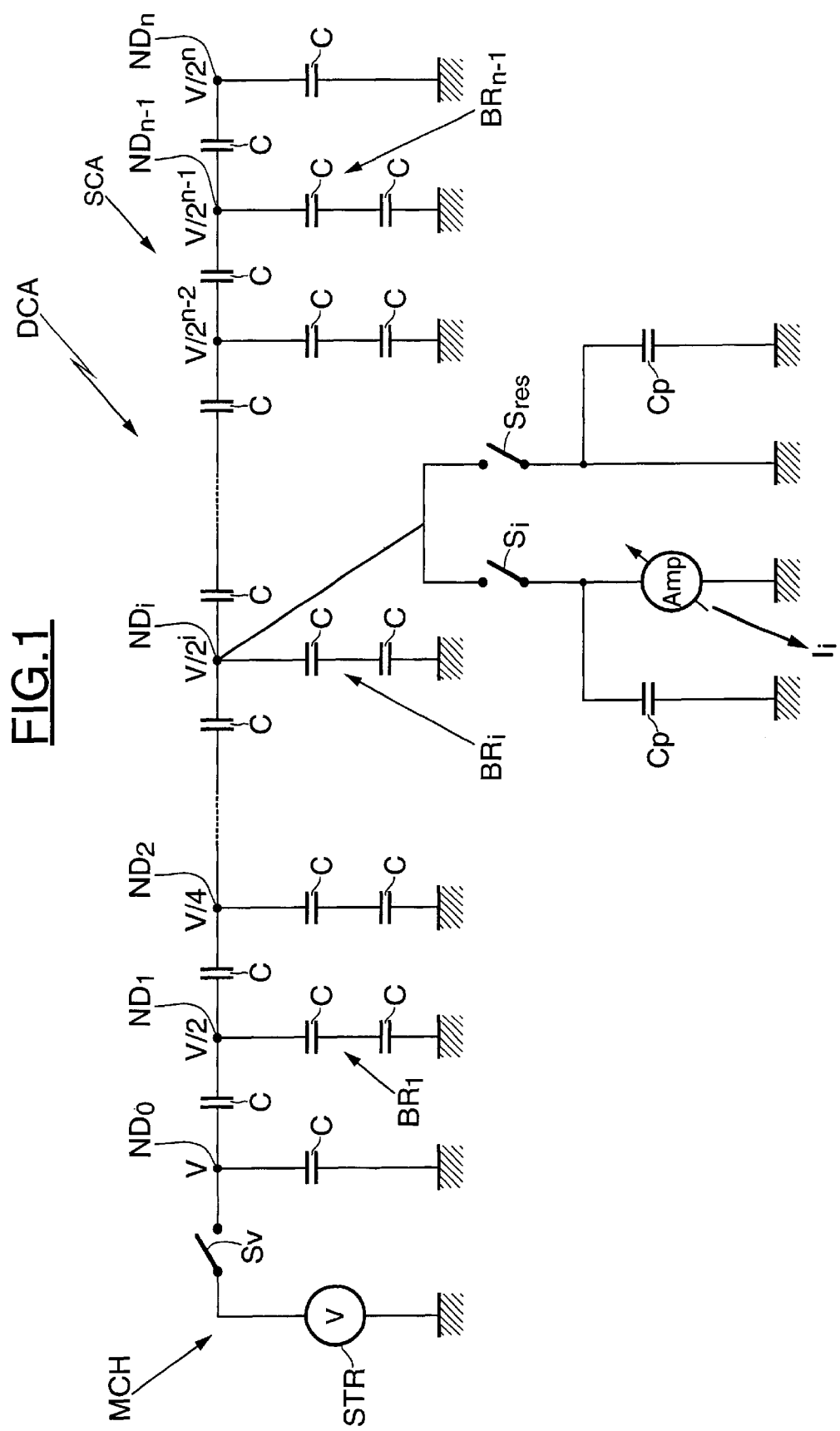
FIG. 1 is a schematic diagram of one embodiment of a device according to the invention.

Turning now to FIG. 1, a checking device CHD according to the invention includes a capacitive structure CAS including an input node $ND_0$ and n output nodes $ND_1$ to $ND_n$, n being an integer greater than or equal to 2. The capacitive structure also includes an integrated capacitor C connected in series between two adjacent nodes $ND_i$ and $ND_{i+1}$. Also provided are an integrated capacitor C connected in series between the nth output node (i.e., the node $ND_n$) and ground and an integrated capacitor C connected in series between the input node (i.e., the node $ND_0$) and ground.

The capacitive structure also includes a capacitive branch $BR_i$ connected between ground and each node $ND_i$ of the capacitive structure. The capacitive branch $Br_i$ includes the first output node $ND_1$ and the (n−1)th output node $ND_{n-1}$. In other words, the capacitive structure CAS includes n−1 capacitive branches $BR_1$ to $BR_{n-1}$ connected to the nodes $ND_1$ to $ND_{n-1}$, respectively. Each capacitive branch $BR_i$ includes two series-connected integrated capacitors C.

All the capacitors C of the capacitive structure are theoretically identical. In practice, they are produced in an integrated manner within a semiconductor substrate. It will be seen in greater detail below that when the checking device CHD is used to check capacitors of integrated circuits produced on a semiconductor wafer, the capacitors of the capacitive structure and the capacitors of the integrated circuits are produced simultaneously using the same fabrication process.

The checking device CHD includes, apart from the capacitive structure CAS, charging means CHM capable of charging each node of the capacitive structure. Charging means CHM include here a reference voltage source RVS delivering a reference voltage V to the input node $ND_0$ via a controllable switch $S_v$. The device CHD furthermore includes measurement means capable of measuring the charge at each of the nodes of the capacitive structure. These measurement means comprise here, for each node of the capacitive structure, a controllable measurement switch $S_i$ connected to the node $ND_i$ and an ammeter Amp connected between the measurement switch $S_i$ and ground. A controllable discharge switch $S_{res}$ is also provided for each node $ND_i$ of the capacitive structure and is connected between the node $ND_i$ and ground. The capacitors $C_s$ represent the stray capacitances of the system.

The capacitive structure CAS according to the invention has significant properties, particularly a node-to-node voltage division and a constant capacitive value at each node. More specifically, with the embodiment illustrated in FIG. 1

(r=1), the voltage at each node of the structure CAS is divided in two with respect to the voltage at the preceding node. With respect to the voltage V of the reference voltage source RVS, the voltage $V_i$ at each node $ND_i$ of the structure CAS is equal to $V/2^i$. Likewise, in the embodiment illustrated in FIG. 1, the capacitive value at each node $ND_i$ is constant and equal to $3C/2$.

Of course, the values of the capacitance at each node and the value of the voltage at each node, indicated above, are theoretical values for the case in which the capacitors C are all theoretically identical. In practice, this will not be the case given especially the matching defect of the capacitors and their non-linearity.

One approach might be to precisely measure the actual value $V_i$ at each node of the capacitive structure and comparing it with the theoretical value. However, this would require the use of a voltmeter which, because of its stray capacitance, could falsify the measurement. The invention therefore advantageously provides for the measurement of the charge $Q_i$ at each node $ND_i$ of the capacitive structure to obtain a value representative of the voltage $V_i$ with substantially no stray capacitance in the measurement chain. Moreover, the charge at each node is divided in the same way as the voltage at each node.

One relatively simple and effective way of measuring this charge includes measuring the current $I_i$ at each node using the ammeter Amp. In this case, all the stray capacitances are then short-circuited by the ammeter. Furthermore, instead of making a single measurement, which would theoretically be possible, a measurement is made several times per second. This makes it possible to average the readings to obtain a more precise reading and to obtain a high enough current $I_i$. Moreover, this procedure allows the random capacitive noise to be eliminated.

Figure 2:
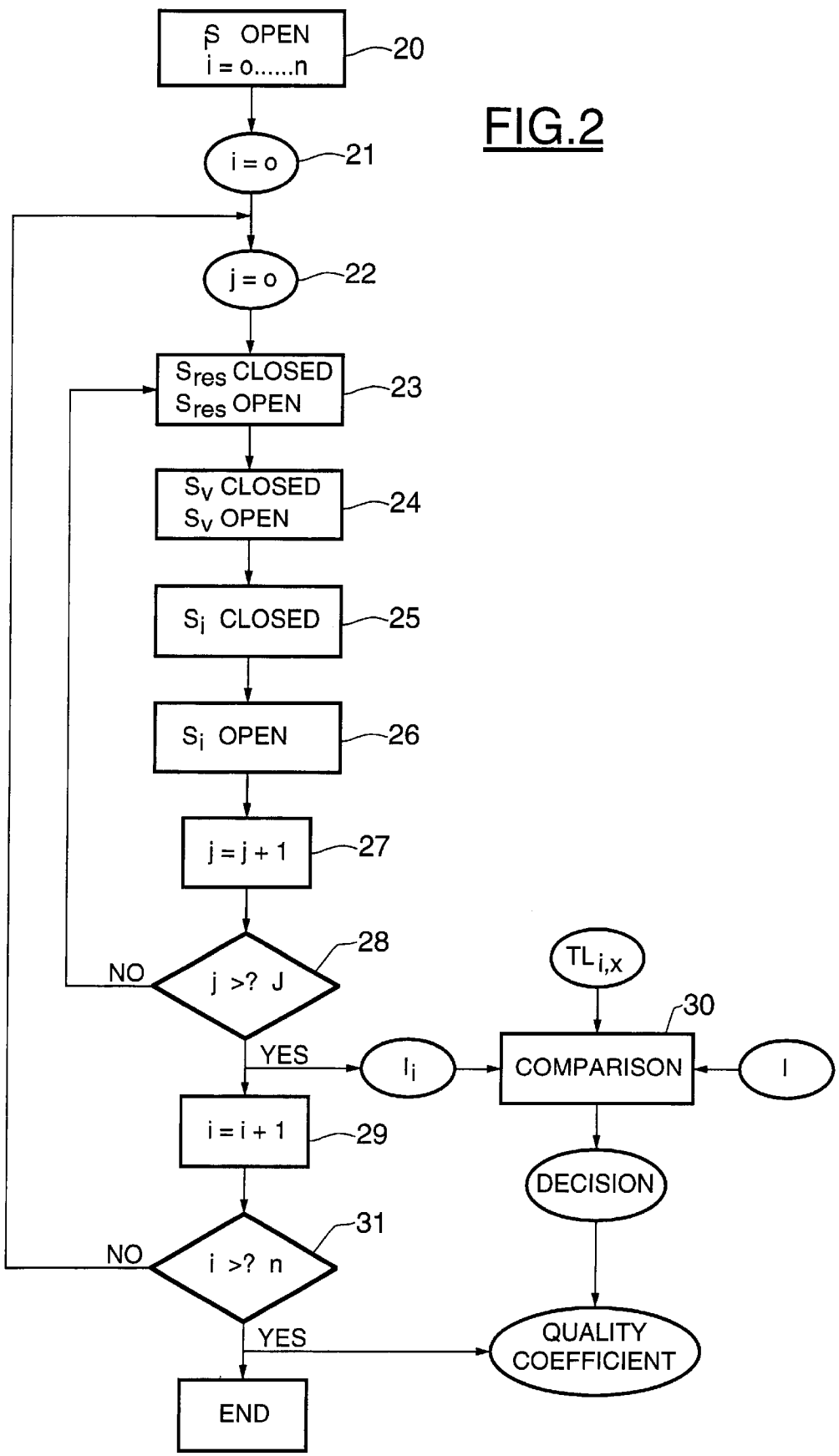
FIG. 2 is a flow diagram illustrating operation of the device in FIG. 1 and a method according to the invention.

To describe such a method of implementation in greater detail, reference is now made to FIG. 2. The charge $Q_i$, or the current $I_i$, is calculated in succession at each of the nodes $ND_i$ with i varying from 0 to n. At the start of the procedure, all the switches $S_i$ are open (step 20). The counter i and a counter j are initialized (steps 21 and 22). In step 23, all the nodes, and consequently the node in question, are discharged by successively closing and opening the switch $S_{res}$.

In step 24, the switch $S_v$ is firstly closed for a predetermined time to charge the nodes of the structure CAS. By way of example, for a capacitor C having a capacitive value of 1 pF, the switch $S_v$ may be left closed for 100 ns. Next, the switch $S_v$ is opened to allow the next reading. To make this reading, the switch $S_i$ is closed in step 25 and then, after a predetermined measurement time, this switch $S_i$ is opened again in step 26.

After having incremented the counter j by one unit (step 27), the cycle is repeated from steps 23 to 27 until the counter j reaches a predetermined final value J corresponding to a predetermined measurement time. By way of example, the time for a discharging, charging and measurement cycle (steps 23 to 26) may be on the order of 1 ms, corresponding to a frequency f of 1 MHZ. The number j is chosen to integrate the measurement over a period on the order of one second, e.g., about three seconds.

As indicated above, the frequency f should be high enough to allow a precise reading of the current with a value which is sufficiently high (e.g., on the order of 1 mA). However, to prevent the occurrence of parasitic phenomena due especially to charge injection into the switches, the frequency f should not be too high. By way of example, a frequency between about 100 kHz and 10 MHZ may therefore be chosen for a capacitor C having a capacitive value of 1 pF. Once the measurement $I_i$ has been taken, the counter i is incremented by one unit (step 29) and the discharging, charging and measurement algorithm is re-executed until all the nodes of the capacitive structure have been considered (step 31).

Returning now to the measurement of the current $I_i$, the value of this current is defined by formula (1) below:

$$I_i = f \cdot Q_i = f \cdot (V/2i) \cdot (3C/2) \tag{1}$$

Likewise, the theoretical value of the current $I_0$, i.e., the current at the input node, is defined by formula (2) below:

$$i\ I_0 = f/Q_0 = f \cdot V \cdot 3C/2 \tag{2}$$

Of course, the values expressed in formulas (1) and (2) are theoretical values.

In practice, taking into account particularly the matching and linearity defects, the ratio of the actual currents $I_i$ and $I_0$ is defined by formula (3) and can be analyzed as the sum of a theoretical value $TH_i \pm$ a tolerance $TL_{i,x}$:

$$I_i/I_0 = Q_i/Q_0 = \underbrace{(1/2^i)}_{TH_i} \pm \underbrace{(1/2^{i+x})}_{TL_{i,x}} \tag{3}$$

In other words, the comparison, made in step 30, of each measured nodal charge value with a theoretical nodal charge value, taking into account a predetermined nodal tolerance, amounts here to the comparison of a current ratio with a theoretical value $TH_i$, taking into account a predetermined tolerance $TL_{i,x}$.

It is thus possible to assign a quality factor $QF_x$, especially with regard to the linearity and matching defect, to the capacitive structure CAS. This quality factor $QF_x$ is in fact the index i of the last node $ND_i$, the current $I_i$ of which satisfies formula (3), i.e., the current $I_i$ of which lies within the fixed tolerance band. Thus, a capacitive structure having the quality factor 4 will have a smaller linearity defect and better matching than a capacitive structure that has obtained the quality factor 2.

The integer x in formula (3) may take values greater than or equal to 1. For any value of x, the tolerance criterion defined by formula (3) is more sensitive to the linearity defects than to the matching defects. On the other hand, an equal sensitivity for linearity defects and for matching defects is obtained with the accumulative criterion defined by formula (4) below:

$$\prod_{k=1}^{i}\left(\frac{\left|\frac{2I_k}{I_{k-1}}-1\right|+1}{2}\right) = \underbrace{(1/2^i)}_{TH_i} \pm \underbrace{(1/2^{i+x})}_{TL_{i,x}} \tag{4}$$

in which i denotes the index of the node in question.

The integer x (where $x \geq 1$) in formula (4) allows the sensitivity of a capacitive structure CAS to be increased for a fixed and given value of n. Typically, if for a structure CAS for which n is equal to 20 the quality factor $QF_1$ obtained for x equal to 1 had its limiting value equal to 20, using a value of x equal to 2 would make it possible, for example, to widen the limit for characterizing the structure CAS and to obtain a quality criterion $QF_2$ of less than 20, corresponding to a greater constraint. Other criteria apart from those defined by formulae (3) and (4) may also be used.

Physically, a microprocessor may be provided which executes, e.g., via software, the method shown in FIG. 2 to control the various switches and to make the comparisons illustrated in step 30. Likewise, the ammeter may be physically connected to the various contact terminals of the capacitive structure CAS by the probes of a conventional tester. The capacitive structure CAS can be used for various applications. It can be used to test, for example, different processes for fabricating capacitors to use the process which will result in the linearity and matching defects in the capacitors being minimized.

The capacitive structure CAS also allows the actual maximum resolution of a switched-capacitor analog-digital converter to be characterized very simply. This is because the quality factor mentioned above (i.e., the number corresponding to the index of the final node of the structure that has satisfied the criterion defined by formula (3) especially or by formula (4), for example) corresponds in fact to a number of bits representative of the maximum resolution of the switched-capacitor analog-digital converter.

Figure 3:
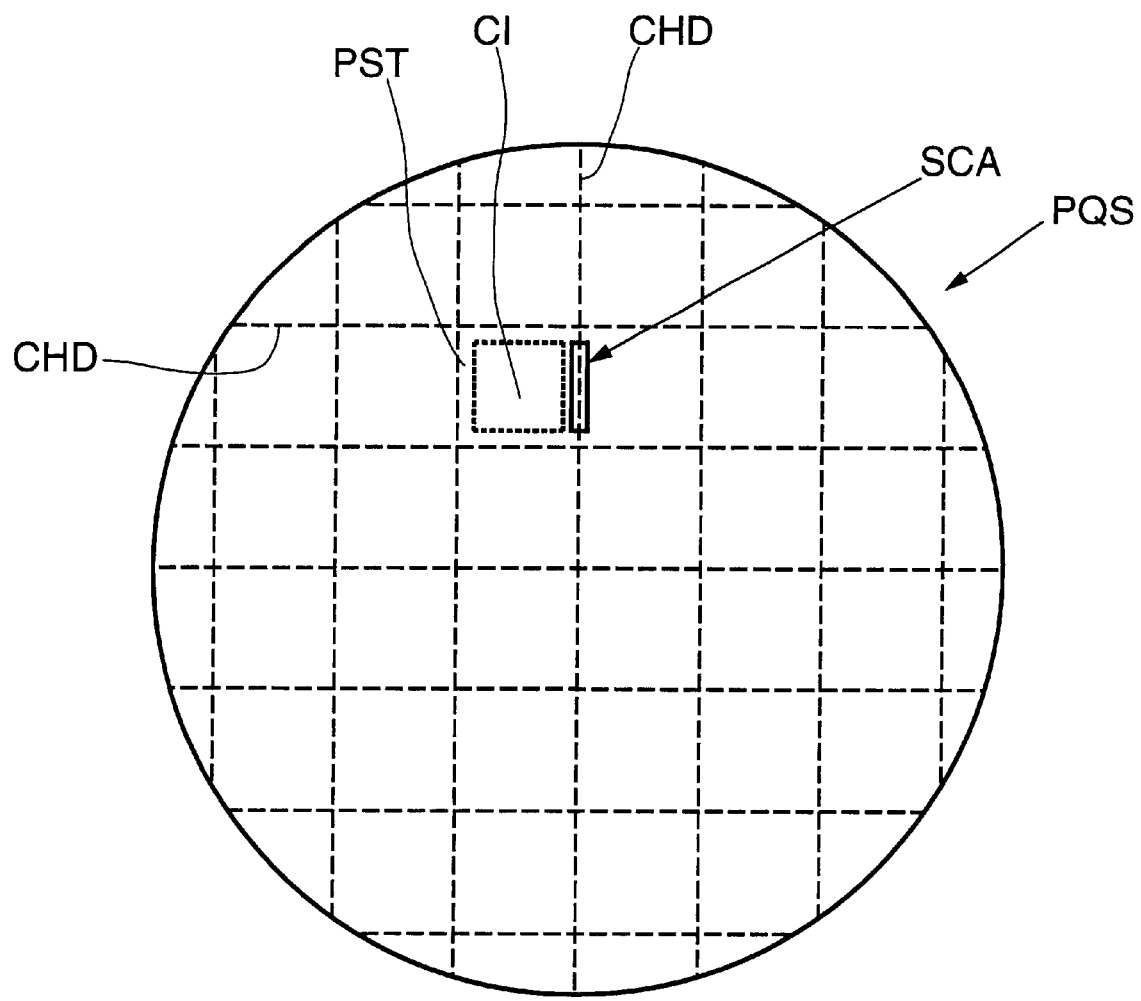
FIG. 3 is a schematic diagram illustrating application of the device and method according to the invention to the checking of the matching defect and the nonlinearity of capacitors of integrated circuits produced on a semiconductor wafer.

The invention also makes it possible to check the matching and linearity defect of integrated-circuit capacitors or the actual maximum resolution of switched-capacitor analog-digital converters. This is done by making this capacitive structure in dicing streets of a semiconductor wafer SCW, like that illustrated in FIG. 3. This is because, conventionally, the wafer SCW has over its surface dicing streets DS by which the silicon dies DIE supporting an integrated circuit IC are bounded.

Once the integrated circuits have been produced, the wafer SCW is diced by sawing along the dicing streets to obtain the various dies supporting the integrated circuits. It is then possible to associate with each integrated circuit IC a capacitive structure CAS which is produced in a dicing street DS adjacent to this integrated circuit IC. The capacitors of the integrated circuit IC may simultaneously be produced using the same fabrication process.

The control and measurement microprocessor and the ammeter are connected to the terminals of the structure CAS and are placed outside the wafer. Next, by determining the quality factor of the capacitive structure CAS associated with this integrated circuit in the manner described above, it is possible to deduce therefrom the quality factor of the capacitors of the integrated circuit and, possibly, the actual maximum resolution of the analog-digital converter forming part of this integrated circuit. This allows the quality of fabrication batches to be compared with one another. Of course, when dicing the wafer, the capacitive structures CAS will be destroyed.

Advantageously, the invention also makes it possible to use a capacitive structure CAS according to the invention as a reference voltage generator (or as a generator for generating reference charge $Q_r$) for a switched-capacitor analog-digital converter ADC, as illustrated schematically in FIG. 4. In this regard, the input node of the structure CAS is connected to the reference voltage V delivered by the reference voltage source RVS. The various nodes of the structure CAS provide various reference voltages which are delivered to a coding logic circuit CLC of conventional structure known to those of skill in the art. This control logic circuit also receives the analog voltage Vin to be converted.

By way of a conventional capacitive-feedback amplifier and a dichotomizing logic circuit associated with a comparator, the output of the analog-digital converter delivers a digital word over n bits corresponding to the input analog voltage Vin. Such a structure CAS is particularly advantageous for use within an analog-digital converter because it is characterized by a very low sensitivity to matching defects (i.e., robustness). This is because if a matching or non-linearity defect exists between capacitors of the structure CAS at a given node, this random-type matching defect will be successively divided by two and compensated for on average upon progressing into the following nodes.

The invention is not limited to the embodiments and methods of implementation that have just been described, but rather encompasses numerous variants thereof. For example, although the embodiment of the structure CAS illustrated above (with two capacitors per branch; r=1) is particularly advantageous for a binary application, it would be possible to use higher values of r (e.g., r=2). This would result in three capacitors per branch and two capacitors in series connecting two adjacent nodes. Voltages successively divided by three and a constant capacitive value at each node equal to 4C/3 would then be obtained.

That which is claimed is:

1. A device for checking integrated capacitors comprising:
   a capacitive structure comprising
      a plurality of nodes comprising an input node and n output nodes, n being an integer greater than or equal to 2,
      an input integrated capacitor connected between said input node and a first reference voltage,
      r intermediate integrated capacitors respectively connected in series between two adjacent nodes, r being an integer greater than or equal to 1,
      an output integrated capacitor connected between the nth output node and the first reference voltage, and
      r capacitive branches each respectively connected in parallel between the first reference voltage and each output node from a first output node through an (n−1)th output node, each capacitive branch comprising r+1 series-connected integrated branch capacitors;
   all of the integrated capacitors being substantially theoretically identical;
   charging means for charging each node;
   measurement means for measuring charge at each node of said capacitive structure; and
   comparison means for comparing each measured nodal charge with a theoretical nodal charge.

2. The device according to claim 1 wherein r is equal to 1.

3. The device according to claim 1 wherein said charging means comprise a reference voltage source providing a second reference voltage and a controllable switch connected between said reference voltage source and said input node.

4. The device according to claim 1 wherein said measurement means comprise, for each node, a controllable measurement switch connected to the respective node and an ammeter selectively connected between said controllable measurement switch and the first reference voltage.

5. The device according to claim 1 further comprising a respective controllable discharge switch connected between each node and the first reference voltage.

6. The device according to claim 1 wherein the integrated capacitors to be checked are included in an integrated circuit on a die of a semiconductor wafer, the die being bounded by dicing streets formed in the semiconductor wafer; and wherein said capacitive structure is in one of the dicing streets.

7. The device according to claim 6 wherein a plate surface area of said integrated capacitors of said capacitive structure is at most equal to a minimum plate surface area of the integrated capacitors to be checked of the integrated circuit.

8. The device according to claim 1 wherein said comparison means compare each measured nodal charge with the theoretical nodal charge while accounting for a predetermined nodal tolerance.

9. A device for checking integrated capacitors comprising:
a capacitive structure comprising
a plurality of nodes comprising an input node and n output nodes, n being an integer greater than or equal to 2,
an input integrated capacitor connected between said input node and a first reference voltage,
r intermediate integrated capacitors respectively connected in series between two adjacent nodes, r being an integer greater than or equal to 1,
an output integrated capacitor connected between the nth output node and the first reference voltage, and
r capacitive branches each respectively connected in parallel between the first reference voltage and each output node from a first output node through an (n−1)th output node, each capacitive branch comprising r+1 series-connected integrated branch capacitors;
all of the integrated capacitors being substantially theoretically identical;
a charge source selectively connected to the input node;
a measurement circuit for measuring charge at each node of said capacitive structure; and
a comparison circuit for comparing each measured nodal charge with a theoretical nodal charge.

10. The device according to claim 9 wherein r is equal to 1.

11. The device according to claim 9 wherein said charge source comprises a reference voltage source providing a second reference voltage and a controllable switch connected between said reference voltage source and said input node.

12. The device according to claim 9 wherein said measurement circuit comprises, for each node, a controllable measurement switch connected to the respective node and an ammeter selectively connected between said controllable measurement switch and the first reference voltage.

13. The device according to claim 9 further comprising a respective controllable discharge switch connected between each node and the first reference voltage.

14. The device according to claim 9 wherein the integrated capacitors to be checked are included in an integrated circuit on a die of a semiconductor wafer, the die being bounded by dicing streets formed in the semiconductor wafer; and wherein said capacitive structure is in one of the dicing streets.

15. The device according to claim 14 wherein a plate surface area of said integrated capacitors of said capacitive structure is at most equal to a minimum plate surface area of the integrated capacitors to be checked of the integrated circuit.

16. The device according to claim 9 wherein said comparison circuit compares each measured nodal charge with the theoretical nodal charge while accounting for a predetermined nodal tolerance.

17. An analog-to-digital (A/D) converter comprising:
a reference voltage generator for generating a plurality of voltages for comparison with an analog voltage to be converted, said reference voltage generator comprising
a plurality of nodes each providing one of the plurality of voltages, said plurality of nodes comprising an input node and n output nodes, n being an integer greater than or equal to 2,
an input integrated capacitor connected between said input node and a reference voltage,
r intermediate integrated capacitors respectively connected in series between two adjacent nodes, r being an integer greater than or equal to 1,
an output integrated capacitor connected between the nth output node and the first reference voltage,
r capacitive branches each respectively connected in parallel between the first reference voltage and each output node from a first output node through an (n−1)th output node, each capacitive branch comprising r+1 series-connected integrated branch capacitors, and
a voltage source connected to said input node,
all of the integrated capacitors being substantially theoretically identical.

18. The A/D converter according to claim 17 wherein r is equal to 1.

19. The A/D converter according to claim 17 further comprising a controllable switch connected between said voltage source and said input node.

20. A method for checking integrated capacitors, comprising:
forming a capacitive structure comprising
a plurality of nodes comprising an input node and n output nodes, n being an integer greater than or equal to 2,
an input integrated capacitor connected between said input node and a reference voltage,
r intermediate integrated capacitors respectively connected in series between two adjacent nodes, r being an integer greater than or equal to 1,
an output integrated capacitor connected between the nth output node and the reference voltage, and
r capacitive branches each respectively connected in parallel between the reference voltage and each output node from a first output node through an (n−1)th output node, each capacitive branch comprising r+1 series-connected integrated branch capacitors, all of the integrated capacitors being substantially theoretically identical;
charging the input node and the output nodes;
measuring charge at each of the input and output nodes of the capacitive structure; and
comparing each measured nodal charge with a theoretical nodal charge.

21. The method according to claim 20 wherein measuring charge comprises a succession of steps performed at a predetermined frequency over a predetermined time, the steps comprising:
discharging the nodes;
charging the nodes;
connecting an ammeter between a node to be measured and the reference voltage; and
disconnecting the ammeter.

22. The method according to claim 20 wherein comparing comprises comparing each measured nodal charge with a theoretical nodal charge while accounting for a predetermined nodal tolerance.

23. The method according to claim 20 wherein the integrated capacitors to be checked are included in a switched-capacitor analog-to-digital converter formed on a semiconductor wafer.

24. A method for checking integrated capacitors using a capacitive structure comprising a plurality of nodes comprising an input node and n output nodes where n is an integer greater than or equal to 2, an input integrated capacitor connected between said input node and a reference voltage, r intermediate integrated capacitors respectively connected in series between two adjacent nodes where r is an integer greater than or equal to 1, an output integrated capacitor connected between the nth output node and the reference voltage, and r capacitive branches each respectively connected in parallel between the reference voltage and each output node from a first output node through an (n−1)th output node, each capacitive branch comprising r+1 series-connected integrated branch capacitors, all of the integrated capacitors being substantially theoretically identical, the method comprising:

charging the input node and the output nodes;

measuring charge at each of the input and output nodes of the capacitive structure; and comparing each measured nodal charge with a theoretical nodal charge.

25. The method according to claim 24 wherein measuring charge comprises a succession of steps performed at a predetermined frequency over a predetermined time, the steps comprising:

discharging the nodes;

charging the nodes;

connecting an ammeter between a node to be measured and the reference voltage; and disconnecting the ammeter.

26. The method according to claim 24 wherein comparing comprises comparing each measured nodal charge with a theoretical nodal charge while accounting for a predetermined nodal tolerance.

27. The method according to claim 24 wherein the integrated capacitors to be checked are included in a switched-capacitor analog-to-digital converter formed on a semiconductor wafer.

* * * * *

UNITED STATES PATENT AND TRADEMARK OFFICE
CERTIFICATE OF CORRECTION

PATENT NO.    : 6,504,380 B2
DATED         : January 7, 2003
INVENTOR(S)   : Raul Andrés Bianchi and Benoît Froment It is certified that error appears in the above-identified patent and that said Letters Patent is hereby corrected as shown below:

Column 6,
Line 14, delete "$iI_0 = f/Q_0 = f \cdot V \cdot 3C/2$" insert -- $I_0 = f/Q_0 = f \cdot V \cdot 3C/2$ --

Line 24, delete "$I_i/I_o = Q_i/Q_o = \dfrac{(1/2^i)}{TH_i} \pm \dfrac{(1/2^{i+x})}{TL_{i,x}}$" insert -- $I_i/I_o = Q_i/Q_o = \dfrac{(1/2^i)}{TH_i} \pm \dfrac{(1/2^{i+x})}{TL_{i,x}}$ --

Line 50, delete "$\prod_{k=1}\left(\dfrac{\left|\dfrac{2I_k}{I_{k-1}}-1\right|+1}{2}\right) = \underbrace{(1/2^i)}_{TH_i} \pm \underbrace{(1/2^{i+x})}_{TL_{i,x}}$" insert -- $\prod_{k=1}^{i}\left(\dfrac{\left|\dfrac{2I_k}{I_{k-1}}-1\right|+1}{2}\right) = \underbrace{(1/2^i)}_{TH_i} \pm \underbrace{(1/2^{i+x})}_{TL_{i,x}}$ --

Signed and Sealed this

Fifth Day of August, 2003

JAMES E. ROGAN
*Director of the United States Patent and Trademark Office*